(12) United States Patent
Nguyen et al.

(10) Patent No.: US 10,917,081 B1
(45) Date of Patent: Feb. 9, 2021

(54) ADJUSTABLE SOFT SHUTDOWN AND CURRENT BOOSTER FOR GATE DRIVER

(71) Applicant: Silicon Laboratories Inc., Austin, TX (US)

(72) Inventors: Long Nguyen, Austin, TX (US); Ion C. Tesu, Austin, TX (US); Michael L. Duffy, Austin, TX (US); John N. Wilson, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/815,435

(22) Filed: Mar. 11, 2020

(51) Int. Cl.
*H03K 17/08* (2006.01)
*H03K 17/0812* (2006.01)
*H02M 1/08* (2006.01)
*H03K 17/18* (2006.01)
*H03K 17/082* (2006.01)
*H03K 17/081* (2006.01)
*H03K 17/16* (2006.01)

(52) U.S. Cl.
CPC ........ *H03K 17/08128* (2013.01); *H02M 1/08* (2013.01); *H03K 17/0828* (2013.01); *H03K 17/08116* (2013.01); *H03K 17/163* (2013.01); *H03K 17/166* (2013.01); *H03K 17/168* (2013.01); *H03K 17/18* (2013.01)

(58) Field of Classification Search
CPC .......... H03K 17/08128; H03K 17/166; H03K 17/163; H03K 17/168; H03K 17/0828; H03K 17/08116; H03K 17/18; H03K 17/08
See application file for complete search history.

(56) References Cited

U.S. PATENT DOCUMENTS

| 6,097,582 | A | 8/2000 | John et al. |
| 7,948,277 | B2 * | 5/2011 | Nakatake ......... H03K 17/08128 327/109 |
| 7,978,453 | B2 * | 7/2011 | Sharaa ............... H03K 17/0822 361/91.1 |
| 8,213,192 | B2 | 7/2012 | Konecny et al. |
| 8,362,800 | B2 | 1/2013 | Or-Bach |

(Continued)

OTHER PUBLICATIONS

Agilent Technologies, "2.0 Amp Gate Drive Optocoupler with Integrated (VCE) Desaturation Detection and Fault Status Feedback," HCPL-316J, Mar. 1, 2005, 33 pages.

(Continued)

*Primary Examiner* — Thomas J. Hiltunen
(74) *Attorney, Agent, or Firm* — Zagorin Cave LLP

(57) ABSTRACT

An apparatus controls a high-power drive device external to a package of a gate driver circuit. A first circuit charges the control node over a first length of time in response to a first signal through the first node indicating an absence of a fault condition and a first level of a control signal. A second circuit discharges the control node over a second length of time in response to a second signal through the second node indicating the absence of the fault condition and a second level of a control signal. A third circuit includes a current amplifier and is configured as a soft shutdown path to discharge the control node over a third length of time in response to the first signal through the first node indicating a presence of the fault condition. The third length of time is different from the second length of time.

20 Claims, 6 Drawing Sheets

(56) References Cited

U.S. PATENT DOCUMENTS

| | | | |
|---|---|---|---|
| 9,054,621 | B2 | 6/2015 | Liu |
| 9,166,499 | B2 | 10/2015 | Suzuki |
| 9,294,019 | B2 | 3/2016 | Liu |
| 9,374,028 | B2 | 6/2016 | Nondahl |
| 9,467,138 | B2 * | 10/2016 | Osanai .............. H03K 17/042 |
| 9,490,738 | B2 | 11/2016 | Nondahl |
| 9,698,654 | B2 * | 7/2017 | Santos .............. H02P 27/06 |
| 10,038,434 | B2 * | 7/2018 | Volke .............. H03K 17/082 |
| 10,469,075 | B2 | 11/2019 | Horvath |
| 10,514,016 | B1 * | 12/2019 | Nodake .............. F02P 17/12 |
| 2004/0136135 | A1 | 7/2004 | Takahashi |
| 2004/0251951 | A1 | 12/2004 | Beck |
| 2008/0106319 | A1 | 5/2008 | Bayerer |
| 2008/0315925 | A1 | 12/2008 | Alfano |
| 2009/0021294 | A1 | 1/2009 | Morishita |
| 2010/0148830 | A1 | 6/2010 | Nilson |
| 2011/0050198 | A1 | 3/2011 | Dong et al. |
| 2011/0157919 | A1 | 6/2011 | Yedevelly et al. |
| 2011/0157941 | A1 | 6/2011 | Yedevelly et al. |
| 2012/0013370 | A1 * | 1/2012 | Mori .............. H03K 17/0828 327/109 |
| 2012/0161841 | A1 | 6/2012 | Dong et al. |
| 2012/0194218 | A1 | 8/2012 | Or-Bach |
| 2012/0218669 | A1 * | 8/2012 | Ioannidis .......... H03K 17/0828 361/18 |
| 2013/0242438 | A1 | 9/2013 | Fukuta |
| 2015/0015309 | A1 * | 1/2015 | Werber .............. H01L 29/7397 327/109 |
| 2015/0070078 | A1 | 3/2015 | Jeong et al. |
| 2015/0085403 | A1 | 3/2015 | Santos et al. |
| 2016/0087560 | A1 | 3/2016 | Miller |
| 2016/0218046 | A1 | 7/2016 | Or-Bach |
| 2016/0359480 | A1 * | 12/2016 | Kim .............. H03K 5/08 |
| 2018/0026629 | A1 | 1/2018 | Ptacek |
| 2018/0115310 | A1 * | 4/2018 | Horiguchi .......... H03K 17/0822 |
| 2018/0351546 | A1 | 12/2018 | Horvath |
| 2019/0229640 | A1 | 7/2019 | Aichriedler |
| 2019/0372567 | A1 * | 12/2019 | Yoshida .......... H03K 17/08128 |

OTHER PUBLICATIONS

Allan, R., "SiC and GaN vs. IGBTs: The Imminent Tug of War for Supremacy," Power Electronics, downloaded from powerelectronics.com, Feb. 24, 2020, 2 pages.

Analog Devices, Inc., "Isolated Half-Bridge Driver with Integrated High-Side Supply," ADuM5230, 2008-2013, 16 pages.

Analog Devices, Inc., "Isolated Half-Bridge Gate Driver with Integrated Isolated High-Side Supply," ADuM6132, 2008-2012 16 pages.

Avago Technologies, "Desaturation Fault Detection Optocoupler Gate Drive Products with Feature: ACPL-333J, ACPL-330J, ACPL-332J, ACPL-331J, and HCPL-316J," Application Note 5324, Jan. 9, 2012, 7 pages.

Avago Technologies, "Dual-Output Gate Drive Optocoupler Interface with Integrated (VCE) DESAT Detection, FAULT and UVLO Status Feedback," ACPL-339J, Jan. 31, 2013, 23 pages.

Avago Technologies, "Active Miller Clamp Products with Feature: ACPL-331J, ACPL-332J," Application Note 5314, Jul. 21, 2010, 6 pages.

Infineon, "EiceDRIVER™ External Booster for Driver IC," Application Note, AN2013-10, Revision 1.6, Aug. 5, 2014, 17 pages.

Infineon, "EiceDRIVER™ High Voltage Gate Driver IC with Reinforced Isolation," Final Datasheet, Revision 2.1, Oct. 22, 2018, pp. 1-33.

Obara, H., et al., "Active Gate Control in Half-Bridge Inverters Using Programmable Gate Driver ICs to Improve Both Surge Voltage and Converter Efficiency," IEEE Transactions on Industry Applications, vol. 54, No. 5, Sep./Oct. 2018, pp. 4603-4611.

Silicon Labs, "AN1009: Driving MOSFET and IGBT Switches Using the Si828x," downloaded from silabs.com on Feb. 21, 2020, 22 pages.

Silicon Labs, "Si8285/86 Data Sheet," downloaded from silabs.com on Feb. 21, 2020, 33 pages.

Texas Instruments, "Fully-Differential Isolation Amplifier," AMC1200 AMC1200B, Apr. 2011—Revised Aug. 2012, 24 pages.

Texas Instruments, "Precision Lowest-Cost Isolation Amplifier," ISO124, Sep. 1997—Revised Sep. 2005, 17 pages.

Texas Instruments, "TI Designs, IGBT Gate Driver Reference Design for Parallel IGBTs with Short-Circuit Protection and External BJT Buffer," TIDUC70A, Dec. 2016—Revised Jan. 2017, 33 pages.

Texas Instruments, "Understanding the Short Circuit Protection for Silicon Carbide MOSFETs," TI TechNotes, Jan. 2018—Revised Mar. 2019, pp. 1-4.

Vacca, G.,"Benefits and Advantages of Silicon Carbide Power Devices Over Their Silicon Counterparts," Semiconductor Today, Compounds & Advanced Silicon, vol. 12, Issue 3, Apr./May 2017, 4 pages.

* cited by examiner

ADJUSTABLE SOFT SHUTDOWN AND CURRENT BOOSTER FOR GATE DRIVER

BACKGROUND

Field of the Invention

The present application is related to circuits and more particularly to control circuits for high-power applications.

Description of the Related Art

In a typical control application, a processor system provides one or more control signals for controlling a load system. During normal operation, a large DC or transient voltage difference may exist between a domain of the processor system and a domain of the load system, thus requiring an isolation barrier between the processor system and the load system. For example, one domain may be "grounded" at a voltage that is switching with respect to earth ground by hundreds or thousands of volts. Accordingly, an intermediate system includes isolation that prevents damaging currents from flowing between the processor system and the load system. Although the isolation prevents the processor system from being coupled to the load system by a direct conduction path, an isolation communications channel allows communication between the two systems using optical (opto-isolators), capacitive, inductive (transformers), or electromagnetic techniques. In at least one embodiment, the isolation communications channel blocks DC signals and only passes AC signals. The intermediate system typically uses a voltage converter and output driver to provide the control signal at voltage levels suitable for the load system.

Referring to FIG. 1, in an exemplary AC motor control application, processor 100, which may be a microprocessor, microcontroller, or other suitable processing device, operates in a first domain (i.e., VDD1, e.g., 5 Volts (V)) and provides one or more signals for a high power load system operating in a second domain (i.e., VDD3, e.g., 600V). Systems 102 each include an isolation barrier 130 and an isolation communications channel for safely communicating control signals from processor 100 to drivers 106, which drive high-power drive devices 108 and 109 of a three-phase inverter used to deliver three-phase power to AC motor 120. Exemplary high-power drive devices include power metal-oxide-semiconductor field-effect transistors (MOSFETs), insulated-gate bipolar transistors (IGBTs), Gallium-Nitride (GaN) MOSFETs, Silicon-Carbide power MOSFETs, or other suitable devices able to deliver high currents over short periods of time.

Voltage converters 104 convert an available power supply voltage from VDD3 to a voltage level (i.e., VDD2, e.g., approximately 15 V) usable by a high side of systems 102 and drivers 106. Note that in other embodiments, a single voltage converter 104 converts one power supply voltage from a first voltage level (e.g., VDD3) to multiple other voltage levels (e.g., VDD1 and VDD2) and/or provides multiple outputs of a particular voltage (e.g., multiple VDD2 outputs corresponding to multiple systems 102). Drivers 106 provide switch control signals at levels required by corresponding high-power drive devices 108 or 109 of the three-phase AC inverter. The load motor requires three-phase power at high power levels. Systems 102 that correspond to high-power devices coupled to VDD3 (high-side inverter devices), are "grounded" at a voltage that is switching with respect to earth ground by the high voltage levels of VDD3. Typical high-power drive devices 108 and 109 of the three-phase AC inverter that are used to drive AC motor 120 require substantial turn-on voltages (e.g., voltages in the range of tens of Volts) and are susceptible to fault conditions that may damage those devices. Accordingly, flexible techniques for handling fault conditions without damaging high-power drive devices or the load that those devices control are desired.

SUMMARY OF EMBODIMENTS OF THE INVENTION

In at least one embodiment of the invention, an apparatus for controlling a high-power drive device external to a package of a gate driver circuit includes a first circuit coupled between a first node and a control node. The first circuit is configured to charge the control node over a first length of time in response to a first signal through the first node indicating an absence of a fault condition and a first level of a control signal. The apparatus includes a second circuit coupled between a second node and the control node. The second circuit is configured to discharge the control node over a second length of time in response to a second signal through the second node indicating the absence of the fault condition and a second level of the control signal. The apparatus includes a third circuit coupled between the first node and the control node. The third circuit includes a current amplifier and is configured as a soft shutdown path to discharge the control node over a third length of time in response to the first signal through the first node indicating the presence of the fault condition. The third length of time is different from the second length of time.

In at least one embodiment of the invention, a method for controlling a high-power drive device external to a package of a gate drive circuit includes charging a control node over a first length of time using a first node in response to an absence of a fault condition and a first level of a control signal. The method includes discharging the control node over a second length of time using a second node in response to the absence of the fault condition and a second level of the control signal. The second length of time is different from the first length of time. The method includes discharging the control node over a third length of time using the first node in response to a presence of the fault condition. The third length of time is different from the second length of time. Discharging the control node over the third length of time includes attenuating a voltage on the control node using a passive element and amplifying a first current through the first node.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 2:
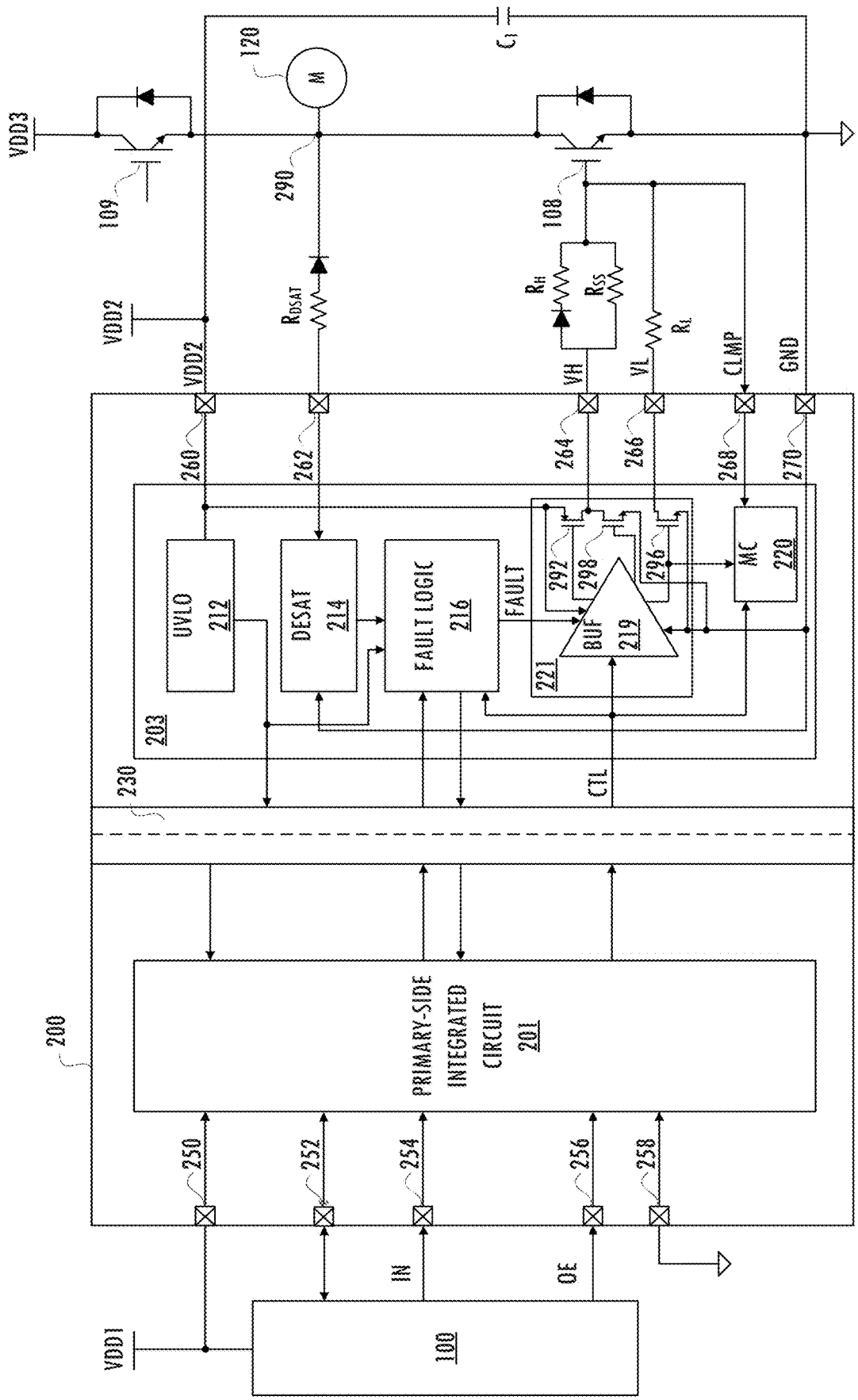
FIG. 2 illustrates a functional block diagram of a portion of the exemplary motor control system of FIG. 1 including fault detection circuitry and driver control circuits.

Referring to FIG. 2, in an exemplary motor control application, processor 100 operates in a first voltage domain (i.e., VDD1, e.g., 5V) and provides one or more signals for a high power load system operating in a second domain (i.e., VDD3, e.g., hundreds of volts). Driver product 200 includes isolation barrier 230 and a communication channel for safely communicating control signals from processor 100 across isolation barrier 230 to drive high-power drive devices 108 and 109 of a three-phase AC inverter used to deliver three-phase power to AC motor 120. In an exemplary embodiment, driver product 200 includes multiple integrated circuits configured as a multi-chip module in a single package. For example, driver product 200 includes primary-side integrated circuit 201 and secondary-side integrated circuit 203. Primary-side integrated circuit 201 receives a control signal from processor 100 and communicates the signal across isolation barrier 230 to secondary-side integrated circuit 203. In such embodiments, terminals 250, 252, 254, . . . , 270 are pins of a package of the multi-chip module and are coupled to external elements, e.g., discrete resistors and capacitors, and to processor 100.

Driver product 200 includes isolation barrier 230, which isolates the domains on a first side (e.g., primary-side integrated circuit 201) of driver product 200, which operates using VDD1 (e.g., a voltage less than ten volts), and a second side (e.g., secondary-side integrated circuit 203) of driver product 200, which operates using VDD2 (e.g., a voltage of tens of volts). An isolation communications channel facilitates communication between primary-side integrated circuit 201 and secondary-side integrated circuit 203. Any suitable communications technique that does not use a conductive path between the two sides may be used, e.g., optical, capacitive, inductive, or electromagnetic techniques. The isolation communications channel facilitates communication of a control signal to secondary-side integrated circuit 203 from processor 100 via primary-side integrated circuit 201.

An exemplary isolation communications channel uses digital modulation (e.g., on-off keying modulation) to communicate one or more digital signals between primary-side integrated circuit 201 and secondary-side integrated circuit 203, although other communication protocols may be used. In general, on-off keying modulation is a form of amplitude-shift keying modulation that represents digital data as the presence or absence of a carrier wave or oscillating signal having a carrier frequency $f_c$ (e.g., 500 MHz-1 GHz). The presence of the carrier for a specified duration represents a binary one, while its absence for the same duration represents a binary zero. This type of signaling is robust for isolation applications because a logic '0' state sends the same signal (e.g., nothing) as when the primary side loses power and the device gracefully assumes its default state. That behavior is advantageous in driver applications because it will not accidentally turn on a load device being driven, even when the primary side loses power. However, the isolation communications channel may use other types of signals (e.g., pulse width modulated signals or other types of amplitude shift keying modulated signals). The digital modulation scheme used may be determined according to performance specifications (e.g., signal resolution) and environment (e.g., probability of transient events) of the target application.

Secondary-side integrated circuit 203 includes driver 221, which generates one or more output control signals based on received control signal CTL received from primary-side integrated circuit 201, which generates the output control signal based on the control signal received from processor 100 via terminal 254. Driver 221 provides corresponding signals to terminals 264 and 266. Buffer 219 generates control signals at appropriate signal levels for controlling pull-up and pull-down devices of driver 221, respectively. Buffer 219 may generate one control signal or two separate control signals for the pull-up device 292 and the pull-down device 296 based on received control signal CTL. Resistor $R_H$ adjusts the pull-up strength linearly related to $1/R_H$ independently from resistor $R_L$ that adjusts the pull-down strength linearly related to $1/R_L$. Although received control signal CTL is illustrated as a single-ended signal based on input control signal CTL received from processor 100 on terminal 254, note that in other embodiments, input control signal IN and received control signal CTL are differential signals. In general, signals illustrated herein as single-ended signals may be implemented as differential signals in other embodiments and signals illustrated herein as differential signals may be implemented as single-ended signals in other embodiments.

The pull-up strength and the pull-down strength of the output control signal provided to the control terminal of high-power drive device 108 can be independently adjusted from on-resistance $R_{DS(ON)}$ of pull-up device 292 coupled to terminal 264 using one or more passive elements. For example, resistor $R_H$ adjusts the pull-up strength. Resistor $R_L$ adjusts the pull-down strength of the signal provided to the gate of high-power drive device 108 via terminal 266 to have a strength different from the pull-up strength of the signal provided to the gate of high-power drive device 108. In a typical configuration, pull-up time tr is slower than the pull-down time to and resistances of resistors $R_H$ and $R_L$ vary with specifications for embodiments of high-power drive device 108 (e.g., power MOSFET, IGBT, GaN MOSFET, Si-Carbide power MOSFET, etc.).

In at least one embodiment, the isolation communications channel feeds back voltage information or fault information from secondary-side integrated circuit 203 to primary-side integrated circuit 201. Primary-side integrated circuit 201 or processor 100 uses that information to adjust operating parameters or generate one or more fault indicators that may be used for automatically handling faults by controlling output driver 221 accordingly. For example, secondary-side integrated circuit 203 includes modules (e.g., desaturation detector 214) that detect fault conditions associated with high-power drive devices and may also detect user-initiated faults received from processor 100. Fault indicator(s) may be used by secondary-side integrated circuit 203 to prevent damage to the high-power drive devices, load system, or user of the load system. In addition, secondary-side integrated circuit 203 may send an indication of a fault or associated diagnostic information to primary-side integrated circuit 201 and/or processor 100.

Figure 1:
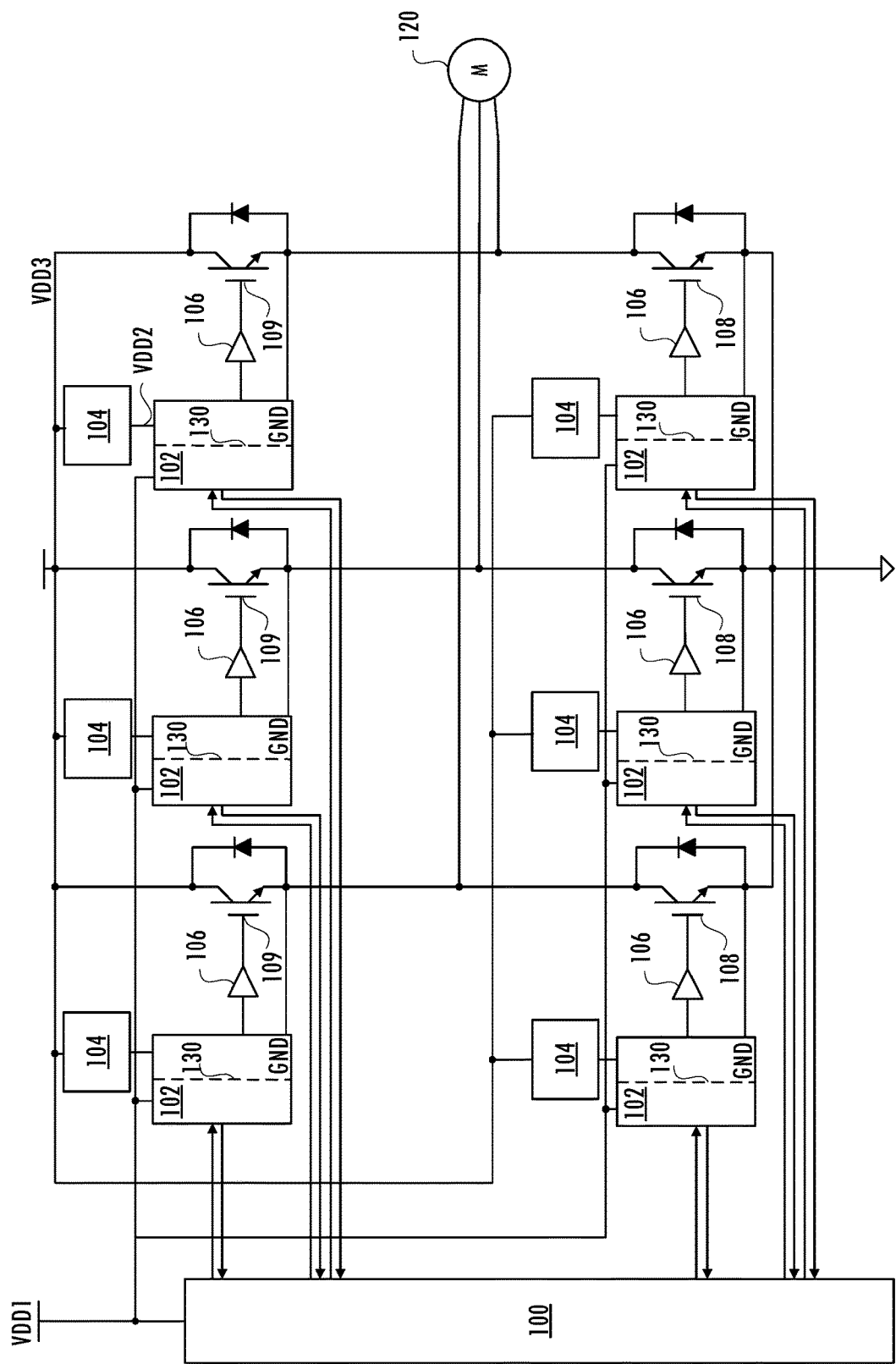
FIG. 1 illustrates a functional block diagram of an exemplary motor control system.

In at least one embodiment, secondary-side integrated circuit 203 includes desaturation fault protection for high-power semiconductor devices, which protects against short-circuit current events that may destroy high-power drive device 108. This fault may result from an insufficient gate drive signal caused by inverter gate driver misbehavior, drive supply voltage issues, a short circuit in a power stage, or other excessive current or power dissipation of the high-power drive devices. Those events can substantially increase power consumption that quickly overheats and damages the corresponding high-power drive device. For example, when a short circuit current condition occurs in the exemplary motor drive application of FIGS. 1 and 2 (i.e., both devices of an individual inverter are on), high current flows through high-power drive devices 108 and 109 and may destroy high-power drive devices 108 and 109. Accordingly, a fault detection technique detects this desaturation condition. Driver product 200 may send an indicator thereof to processor 100, and driver product 200 or processor 100 may trigger a shutdown of a corresponding high-power drive device.

Desaturation fault protection reduces or turns-off over currents during the fault condition. In a typical application, terminal 262 is coupled to an external resistor and diode that are coupled to a terminal of high-power drive device 108 (e.g., the collector terminal of an IGBT or drain terminal of a MOSFET). Desaturation detection circuit 214 senses when the collector-emitter voltage (or drain-source voltage, as the case may be) of high-power drive device 108 exceeds a predetermined threshold level (e.g., 7 V). Note that the predetermined threshold level of desaturation detection circuit 214 may be externally adjusted based on the forward voltage of one or more diodes coupled to the desaturation resistor coupled to terminal 262 or based on the resistance of the desaturation resistor $R_{DSAT}$. In addition, a delay time may be introduced by coupling a capacitor (not shown) between terminal 262 and an external power supply node.

In general, undervoltage lockout detector 212 prevents application of insufficient voltage to the control terminal of high-power drive device 108 by forcing the output on terminal 264 to have a low voltage during power-up of driver product 200. Undervoltage lockout detector 212 detects when the power supply voltage (e.g., VDD2 sensed using terminal 260) exceeds a first predetermined undervoltage lockout threshold voltage and generates an indication thereof, which may be used to disable the lockout condition. Undervoltage lockout detector 212 also detects when the power supply voltage falls below a second predetermined undervoltage lockout threshold, which may be different from the first undervoltage lockout threshold voltage, to provide noise margin for the undervoltage lockout voltage detection. The indicator generated by undervoltage lockout detector 212 may be provided to processor 100 using terminal 252.

Miller clamp 220 reduces effects of parasitic turn-on of high-power drive device 108 due to charging of the Miller capacitor (e.g., the collector-to-gate parasitic capacitor of an IGBT device or the drain-to-gate parasitic capacitor of a MOSFET in other embodiments of high-power device 108). That gate-collector coupling can cause a parasitic turn on of device 108 in response to a high transient voltage (e.g., a gate voltage spike) generated while high-power drive device 108 is turned off. A gate voltage spike is created when turning on another high-power drive device coupled to high-power drive device 108. For example, when turning on upper high-power drive device 109, a corresponding lower high-power drive device 108 coupled to upper high-power drive device 109 experiences a voltage change $dV_{CE}/dt$ causing current flow into the gate drive terminal coupled to lower high-power drive device 108. Miller clamp 220 senses that current using terminal 268, which is coupled to the gate of lower high-power drive device 108. That current creates a voltage drop across any gate resistance and increases the gate-emitter voltage of a corresponding lower high-power drive device. If the gate-emitter voltage exceeds the device threshold voltage (e.g., 2 V), then high-power drive device 108 turns on. A similar parasitic turn-on event occurs when turning on high-power drive device 108 and the corresponding upper high-power drive device 109 is in an off state.

Miller clamp 220 couples terminal 268 to ground via a low-resistance switch that hinders or prevents the Miller capacitor current from developing a voltage sufficient to turn on the high-power drive device. In some embodiments of driver product 200, Miller clamp 220 is not needed because a sufficiently sized gate capacitor coupled between the gate and emitter of each high-power drive device 108 shunts any Miller current and raises the level of the transient needed to parasitically turn on the device. However, such embodiments increase the gate charge voltage required to reach the threshold voltage of high-power drive device 108, increase the driver power, and increase switching losses of high-power drive device 108. In other embodiments of driver product 200, secondary-side integrated circuit 203 is referred to a negative voltage rather than ground by coupling terminal 270 to a negative power supply (e.g., −5 V). This configuration provides additional voltage margin to increase the likelihood that the parasitic turn-on transient does not raise the control terminal of high-power drive device 108 above its threshold voltage. However, this configuration may require an additional cost for generating the negative voltage.

Upon detection of a fault condition by modules on secondary-side integrated circuit 203, fault logic 216 generates control signal FAULT, which may initiate shutdown of high-power drive device 108. Fault logic 216 reports the fault condition to processor 100 via primary-side integrated circuit 201. Alternatively, fault logic 216 only reports the fault condition to primary-side integrated circuit 201 and high-power drive device 108 continues operation. Then, primary-side integrated circuit 201 reports the fault condition to processor 100. Since a system may include multiple high-power drive devices (e.g., six high-power drive devices in the exemplary motor control application described herein), shutting down only one of these devices may harm the high-power drive devices or the load. Therefore, in response to detection of a fault, processor 100 may initiate a shutdown of high-power drive device 108 only after detecting a predetermined number of faults over a particular period of time or other condition is satisfied. In at least one embodiment, processor 100 initiates shutdown of high-power drive device 108 independently from any fault detection of driver product 200 (e.g., based on fault detection from another driver product 200 associated with another high-power drive device 108 or 109).

An abrupt shutoff of high-power drive device 108 may result in large dI/dt induced voltage spikes. Such voltage spikes could be damaging to the drive circuit or the load. Accordingly, in response to a fault condition, processor 100 or driver product 200 initiates a soft shutdown of high-power drive device 108 using device 298 that slowly discharges the control node coupled to the gate terminal of high-power drive device 108 at a rate having a fall time longer than the regular fall time of the output control signal. For example, fault logic 216 receives indicators from undervoltage lockout detector 212 and desaturation detection circuit 214 and generates control signal FAULT based thereon to initiate a soft shutdown.

In an embodiment of gate drive product 200 that includes a terminal coupled to pull-up device 292 and a pin coupled to pull-down device 296, soft shutdown is implemented by coupling pull-down device 298, which is a smaller switch than pull-down device 296, to pull-up device 292. Accordingly, the signal provided to the high-power drive device has a pull-up strength that is linearly related to $1/(R_H \| R_{SS})$, a pull-down strength linearly related to $1/R_L$, and a soft shutdown pull-down strength based on $$\frac{1}{R_{TOT}} = \frac{1}{(R_{SS}) + R_{SW298}}.$$

In general, the pull-up or pull-down speed is linearly related to $$\frac{1}{R_{TOT}}.$$

In this embodiment of driver product 200, soft shutdown impedance $R_{SS}$ may be excluded in applications where the strength of pull-down device 298 provides sufficiently low soft shutdown pull-down strength. In addition, the diode may be excluded. Although soft shutdown impedance $R_{SS}$ affects both the rise time and the soft shutdown time of the control signal, the configuration of the three external resistors and the two terminals provides three degrees of freedom for programming the rise time, fall time, and soft shutdown fall time of the control signal provided to the gate of high-power drive device 108. Accordingly, the soft shutdown fall time of the control signal can be adjusted independently from the regular fall time and independently from the rise time. In at least one embodiment, a diode is coupled between terminal 264 and resistor $R_H$. Note that in other embodiments, terminals 264 and 266, pull-up device 292, pull-down devices 296 and 298, and passive elements between high-power drive device 108 and terminals 264 and 266 implement different configurations of rise-time, fall-time, and soft shutdown fall time. For example, terminal 264, pull-up device 292, pull-down device 298, and passive elements coupled between terminal 264 and high-power drive device 108 may be configured to implement the rise time and fall time of the control signal in the absence of a fault condition and terminal 266, pull-down device 296, and passive elements coupled between terminal 266 and high-power drive device 108 may be configured to implement the soft shutdown fall time. In such embodiments, the soft shutdown fall time of the control signal can be adjusted independently from the regular fall time and to have a strength different from the strength of the rise time.

Figure 3A:
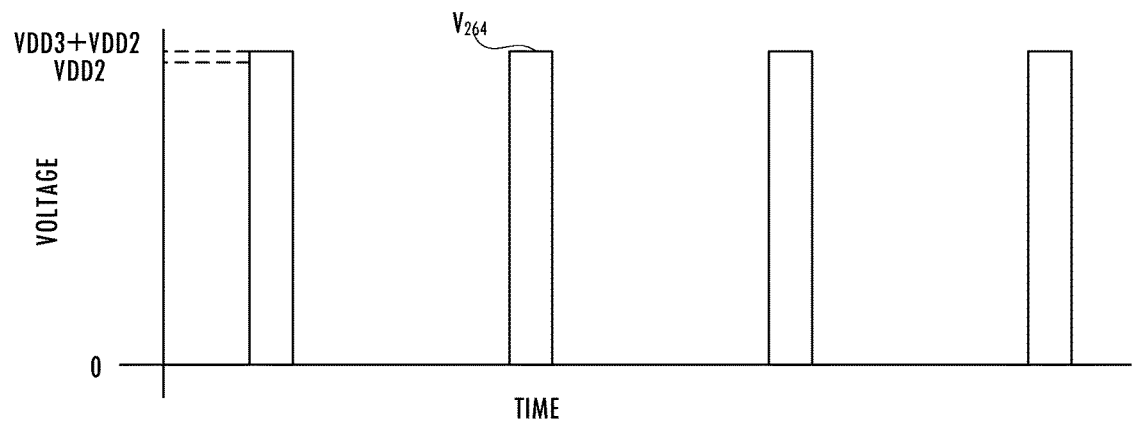
FIGS. 3A-3C illustrate voltage waveforms of a switching node of the motor control system of FIG. 2.
Figure 3B:
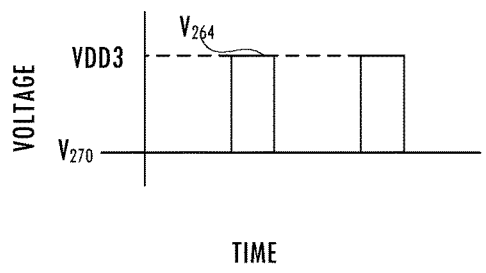
Figure 3C:
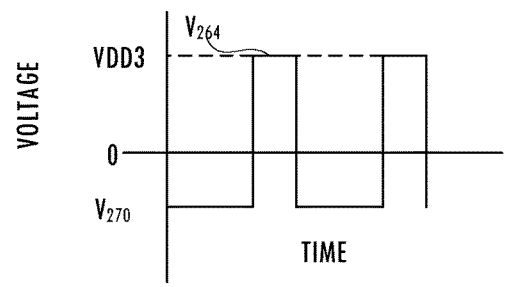

Exemplary waveforms of the voltages associated with high-power drive device 108 for a three-phase power application are illustrated in FIGS. 3A-3C. FIG. 3A illustrates the switching voltage on terminal 264 when driver product 200 drives the high-side switch of an inverter (e.g., high-power device 109) and terminal 270 is coupled to node 290, i.e., driver product 200 is "grounded" at a voltage that is switching with respect to earth ground by VDD2 (e.g., hundreds or thousands of volts). FIG. 3B illustrates the voltage on terminal 264, as generated by driver product 200 when driving the corresponding low-side switch of the inverter (e.g., high-power device 108) and terminal 270 is coupled to earth ground. FIG. 3C illustrates the voltage on terminal 264, as generated by driver product 200 when driving the low-side switch of the inverter (e.g., high-power device 108) and terminal 270 is coupled to −VSS2.

Figure 4:
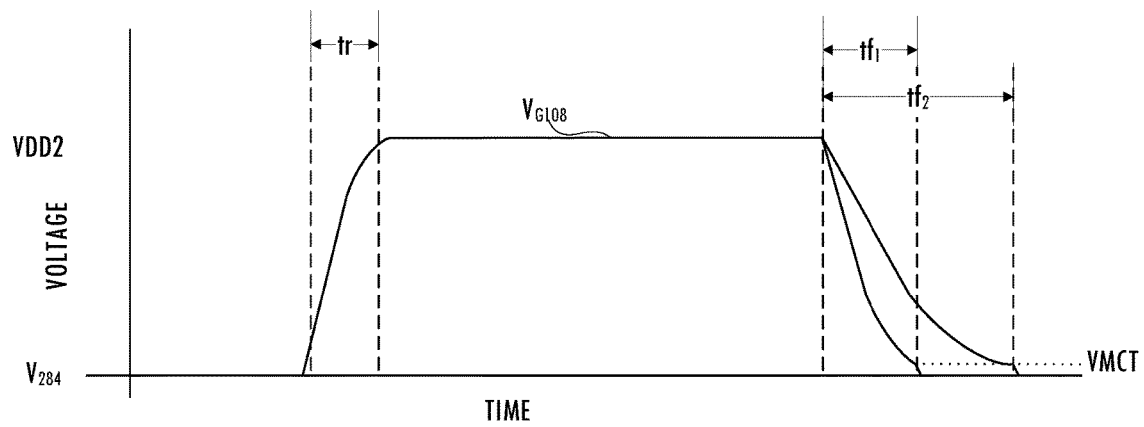
FIG. 4 illustrates details of the exemplary control signal of the gate drive circuit of FIG. 2 consistent with at least one embodiment of the invention.

An exemplary waveform of the voltage provided to the control terminal of high-power drive device 108 is illustrated in FIG. 4. In the absence of a fault condition, the voltage on the gate of high-power drive device 108 has a rise time of tr and a fall time of $tf_1$. The soft shutdown fall time of terminal 264 is $tf_2$ (e.g., where $tf_2 > tf_1$) when pull-down device 298 is enabled. At Miller clamp threshold voltage VMCT (e.g., VSSB+2 V), Miller clamp 220 couples terminal 268 to ground via a low-resistance switch that hinders or prevents the Miller capacitor current from developing a voltage sufficient to turn on the high-power drive device.

Different embodiments high-power drive device 108 (e.g., IGBT and SiC MOSFET) have different characteristics and short circuit protection requirements that demand flexibility of the external circuit coupled between driver product 200 and high-power device 108 for achieving target performance with each of the embodiments. In general, SiC MOSFETs have increased intrinsic switching speed, lower thermal dissipation capability, longer lifetimes, and smaller surge current capability than comparable IGBT drive devices. In response to a short-circuit event, the collector current of an IGBT increases and the IGBT sharply transitions from a saturation region of operation to an active region of operation. The collector current and therefore the power consumption are self-limited and become independent of collector-emitter voltage $V_{CE}$. In contrast, a SiC MOSFET transitions from a linear region of operation to a saturation region of operation. The transition from linear region to saturation region of the SiC MOSFET occurs at a substantially higher voltage than the transition from the saturation region of operation to an active region of operation of the comparable IGBT. The drain current of the SiC MOSFET keeps increasing along with the increasing VDS and the SiC MOSFET may be destroyed before reaching the transition point, making short circuit protection of SiC MOSFETs different from short circuit protection of an IGBT. A short circuit detection time for a SiC MOSFET needs to be long enough to avoid false triggering (e.g., as a result of noise due to the fast switching speed of the SiC MOSFET) but fast enough to protect the SiC MOSFET. Therefore, a soft shutdown time appropriate for an IGBT is inappropriate for a SiC MOSFET. In addition, since the SiC MOSFET has smaller physical size, it has a shorter time that it can withstand an over current condition before damaging the device (e.g., the over current detection and turn off response time for an exemplary IGBT is approximately four microseconds and the over current detection and turn off response time for an exemplary SiC MOSFET is approximately one microsecond).

A conventional soft shutdown technique includes a capacitor (e.g., a 10 nF capacitor) to control the soft shutdown timing. However, this capacitor causes unwanted side effects on the turn-on and turn-off timing control between the gate driver and the switching device. The charging of this capacitor consumes power and affects the rate of turn on and turn off of the high-power drive device. A conventional current boosting technique uses a complementary pair of bipolar transistors between the gate driver and the switching device to boost the turn on or turn off current at the expense of the conventional soft shutdown path. Moreover, some applications need additional current drive capability e.g., applications that couple multiple high-power drive devices in parallel for power conversion equipment with higher output power ratings where a single high-power drive device cannot provide the required load current. Thus, a soft shutdown technique should be flexible and compatible with current-boosting techniques.

The embodiment of FIG. 2 provides a user little flexibility for adjusting the soft shutdown fall time $tf_2$ and no flexibility to increase the strength of the soft shutdown. In addition, the implementation of FIG. 2 sinks all current from the gate of high-power drive device 108 to ground via driver product 200. In some embodiments, that current may exceed the capabilities of driver product 200 or cause temperature increases that exceed the capabilities of the device(s) that are configured for soft shutdown in driver product 200. Conventional techniques that increase adjustable soft shutdown flexibility, e.g., using trim bit internal to driver product 200 increase the complexity of driver product 200 and may not provide the target flexibility.

FIGS. 5A-8 describe exemplary embodiments of a flexible soft shutdown technique that is compatible with various embodiments of high-power drive device 108 (e.g., IGBT and SiC MOSFET) and is compatible with current boosting techniques. The parallel combination of resistor $R_H$ and soft shutdown impedance $R_{SS}$ of FIG. 2 is replaced with circuit 502 of FIGS. 5A and 5B. A current amplifier (e.g., bipolar transistor Q3) is coupled externally to driver product 200 and increases flexibility of the soft shutdown impedance. The addition of transistor Q3 to soft shutdown impedance $R_{SS}$ provides full control of the soft shutdown impedance. In an exemplary embodiment, soft shutdown impedance $R_{SS}$ (e.g., 2Ω-1 kΩ), transistor Q3, and resistor $R_B$ (e.g., 100Ω) provide adjustable soft shutdown speed. Soft shutdown impedance $R_{SS}$ can be selected to softly turn off high-power drive device 108 at a target rate (e.g., a rate that reduces or minimizes voltage spikes while keeping the short circuit duration within a switching device specification).

Figure 5A:
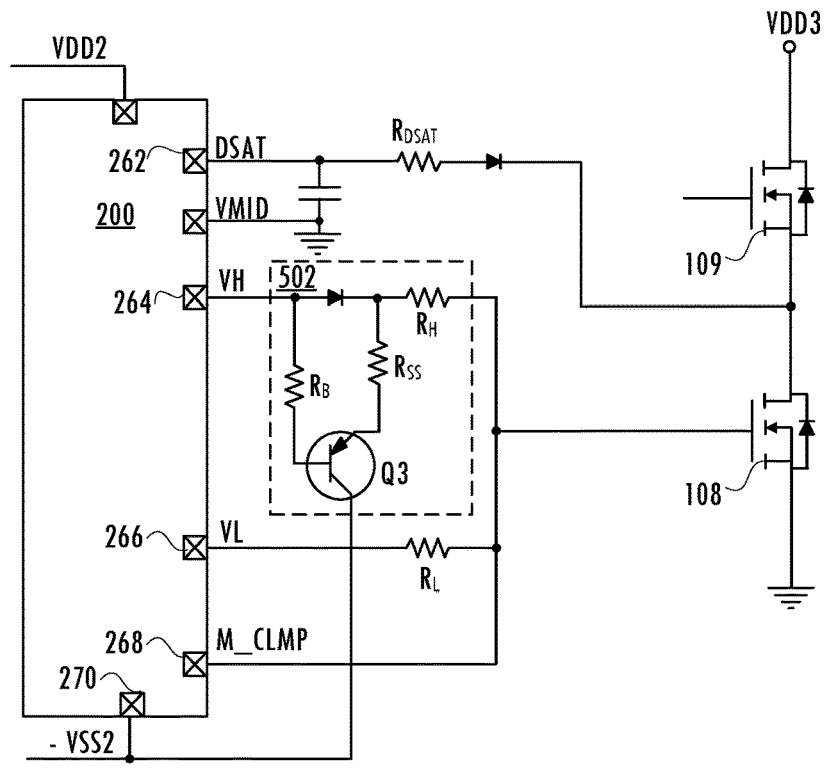
FIGS. 5A and 5B illustrate a functional block diagrams of a portion of a motor control system with adjustable soft shutdown consistent with various embodiments of the invention.
Figure 5B:
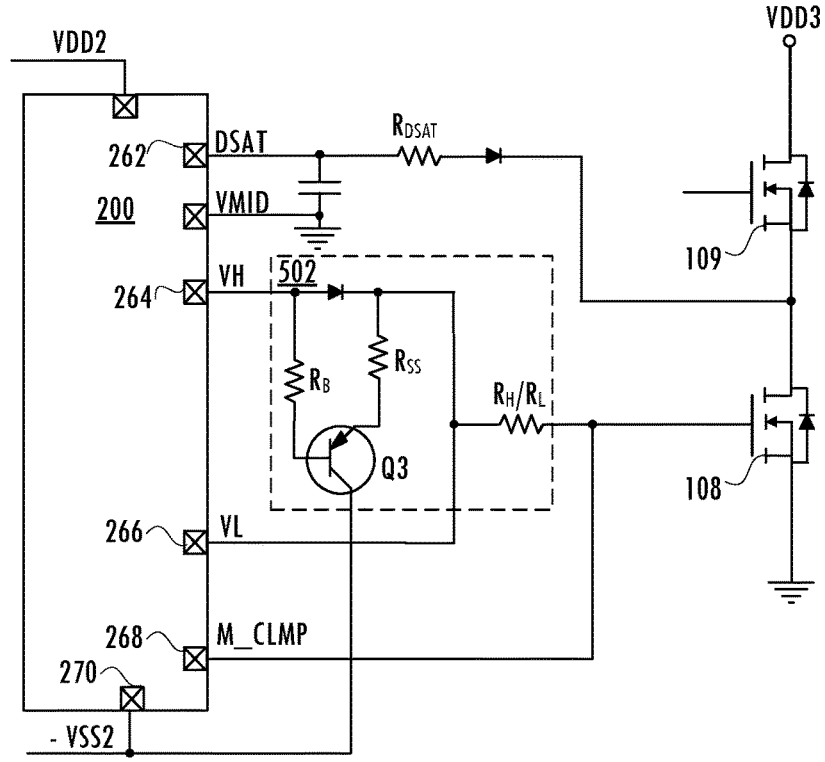

In the absence of a fault condition (e.g., the desaturation condition) and in response to a control signal received by driver product 200 having a first level (e.g., a level to turn on high-power drive device 108), circuit 502 conducts current from terminal 264, through a diode and resistor $R_H$, and to the gate of high-power drive device 108, thereby charging the gate of high-power drive device 108 to turn on high-power drive device 108. In the presence of the fault condition, driver product 200 sinks a current received via terminal 264 from high-power drive device 108 to −VSS2, thereby softly disabling high-power drive device 108. Circuit 502 conducts current from the gate of high-power drive device, through resistor $R_H$ and soft shutdown impedance $R_{SS}$, into the emitter of transistor Q3. Transistor Q3 amplifies the base current by the gain of transistor Q3 to quickly discharge the gate of high-power drive device 108 by sinking collector current directly to power supply node −VSS2 and sinking a smaller base current to power supply node −VSS2 via driver product 200. FIG. 5B illustrates an embodiment of circuit 502 that uses the same resistor as resistor $R_H$ to turn on high-power drive device 108 and resistor $R_L$ to turn off high-power drive device 108 in the absence of a fault condition. In this embodiment, charging the gate of high-power drive device 108 to turn on high-power drive device 108 in the absence of a fault condition takes the same amount of time as discharging the gate of high-power drive device 108 to turn off high-power drive device 108 in the absence of a fault condition.

The value of soft shutdown impedance $R_{SS}$ can be selected to softly turn off high-power drive device 108 at a rate that reduces or minimizes voltage spikes while keeping the short circuit duration within a limit for the embodiment of high-power drive device 108. Circuit 502 is configurable to attenuate the signal using soft shutdown impedance $R_{SS}$. The gain β of transistor Q3 can be selected to increase the current being sunk to ground by small changes in base current and a small increase of the amount of current sunk to ground through driver product 200. Below the threshold voltage of transistor Q3, no base current flows into terminal 264 from transistor Q3 and transistor Q3 does not amplify a base current. Rather, below the threshold voltage of transistor Q3, no current flows between the collector and emitter of transistor Q3 to power supply node −VSS2. Exemplary values of $R_H$, $R_L$, and $R_{SS}$ for different gated power switch devices are illustrated in Table 1.

TABLE 1

|  | $R_H$ | $R_L$ | $R_{SS}$ |
| --- | --- | --- | --- |
| IGBT | 1-30 Ω | 1-20 Ω | 20-50 Ω |
| SiC MOSFET | 1-20 Ω | 1-10 Ω | 2-30 Ω |
| GaN MOSFET | 1-20 Ω | 1-10 Ω | 2-20 Ω |

Figure 6:
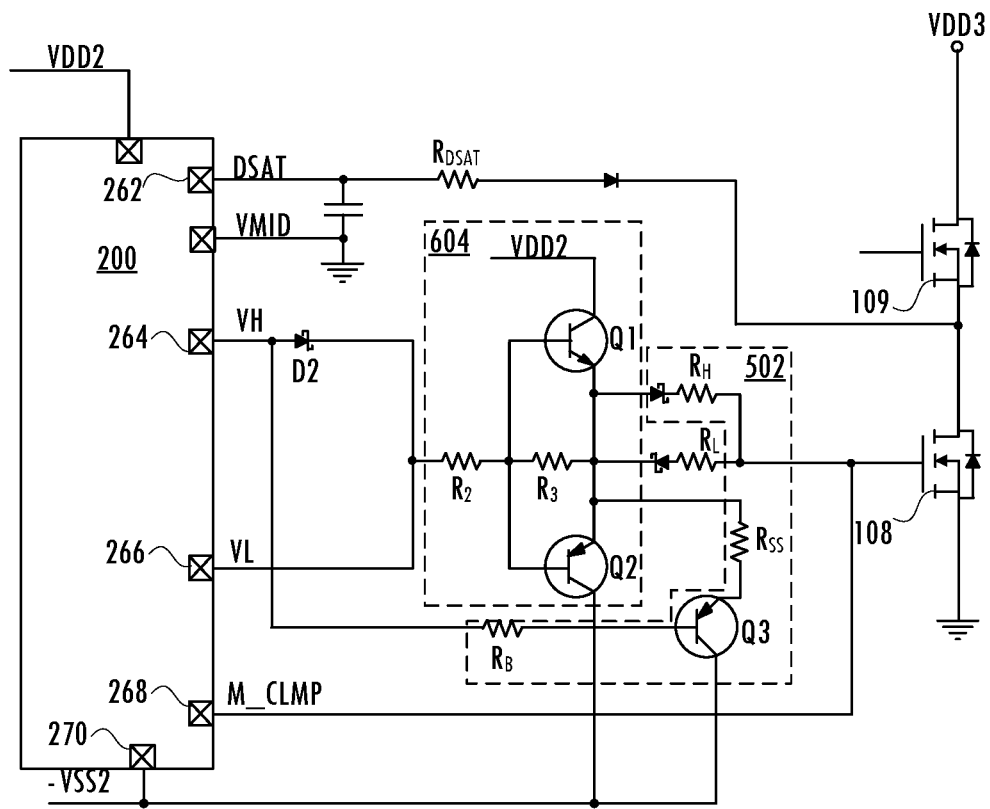
FIG. 6 illustrates a functional block diagram of a portion of a motor control system with adjustable soft shutdown and current booster consistent with at least one embodiment of the invention.

The flexible soft shutdown technique is compatible with current boosting techniques used in high power applications. Referring to FIG. 6, current booster 604 amplifies the current generated by driver product 200. In at least one embodiment, current booster 604 includes a push-pull amplifier coupled between circuit 502 and terminals 264 and 266. Circuit 502 provides the adjustable soft shutdown impedance without affecting current booster 604. In the absence of a fault and in response to the control signal received by driver product 200 having a value for turning on high-power drive device 108, current booster 604 amplifies a base current of transistor Q1 received from terminal 264 via diode D2, and resistor $R_2$. The boosted base current flows through resistor $R_H$ to charge the gate of high-power drive device 108, thereby turning on high-power drive device 108.

In the absence of the fault and in response to the control signal received by driver product 200 having a value for turning off high-power drive device 108 via terminal 266, driver product 200 sinks a base current of transistor Q2 to power supply node −VSS2 via resistor $R_2$ and terminal 266. Current boosting circuit 604 amplifies the base current of transistor Q2 to generate the current flowing from the gate of high-power drive device 108 via resistor $R_L$ into the emitter of Q2 and to power supply node −VSS2 directly via the collector of transistor Q2 and indirectly via the base of transistor Q2, resistor $R_2$, terminal 266, and driver product 200, thereby disabling high-power drive device 108. Resistor $R_3$ reduces or minimize the output voltage drop across the p-n junctions of transistor Q1 and transistor Q2 in a forward conduction mode of current boosting circuit 604.

In the presence of the fault condition, driver product 200 sinks a current received via terminal 264, resistor $R_B$, and terminal 264 to softly disable high-power drive device 108. Circuit 502 conducts current from the gate of high-power drive device 108 through resistor $R_L$ and soft shutdown impedance $R_{SS}$ into the emitter of transistor Q3. Transistor Q3 amplifies a base current by the gain of transistor Q3 to discharge the gate of high-power drive device 108 to power supply node −VSS2 directly via the collector of transistor Q3 and indirectly via the base of transistor Q3, resistor $R_B$, terminal 264, and driver product 200, thereby softly shutting down high-power drive device 108.

Figure 7:
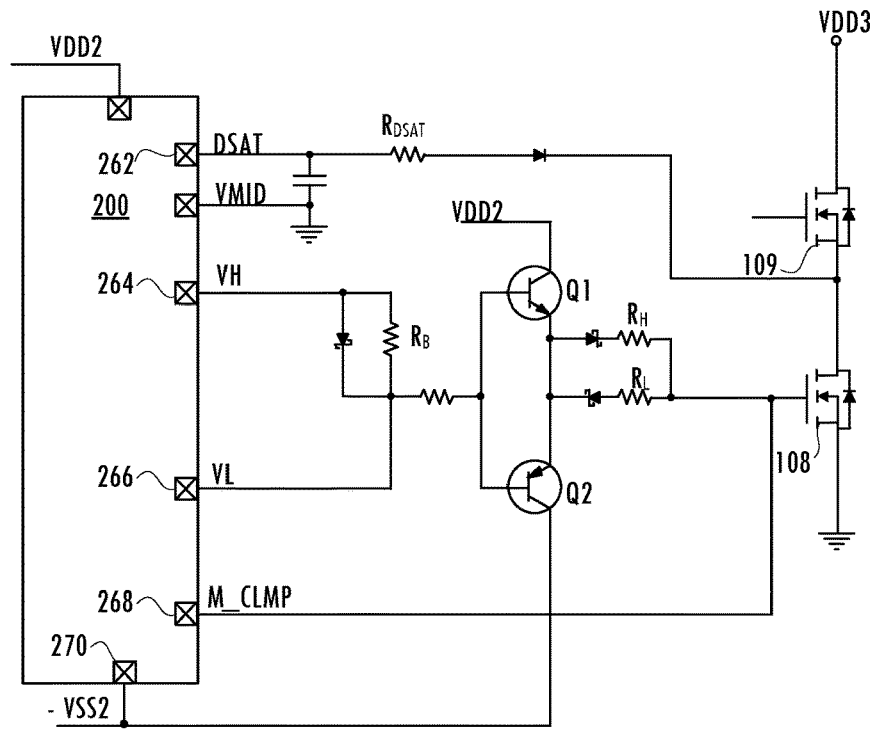
FIG. 7 illustrates a functional block diagram of a portion of a packaged driver integrated circuit product with a cost-reduced adjustable soft shutdown and current booster consistent with at least one embodiment of the invention.

Referring to FIG. 7, a cost-reduced embodiment of the adjustable soft shutdown and current-booster technique incorporates the transistor of the adjustable soft shutdown circuit with the turn-off path of the current boosting circuit. Transistor Q2 is included in the turn off path of the current booster in addition to the soft shutdown path. The resulting soft shutdown impedance $R_{SS}$ is $R_B/\beta_{Q2}$, where $\beta_{Q2}$ is the gain of transistor Q2.

Figure 8:
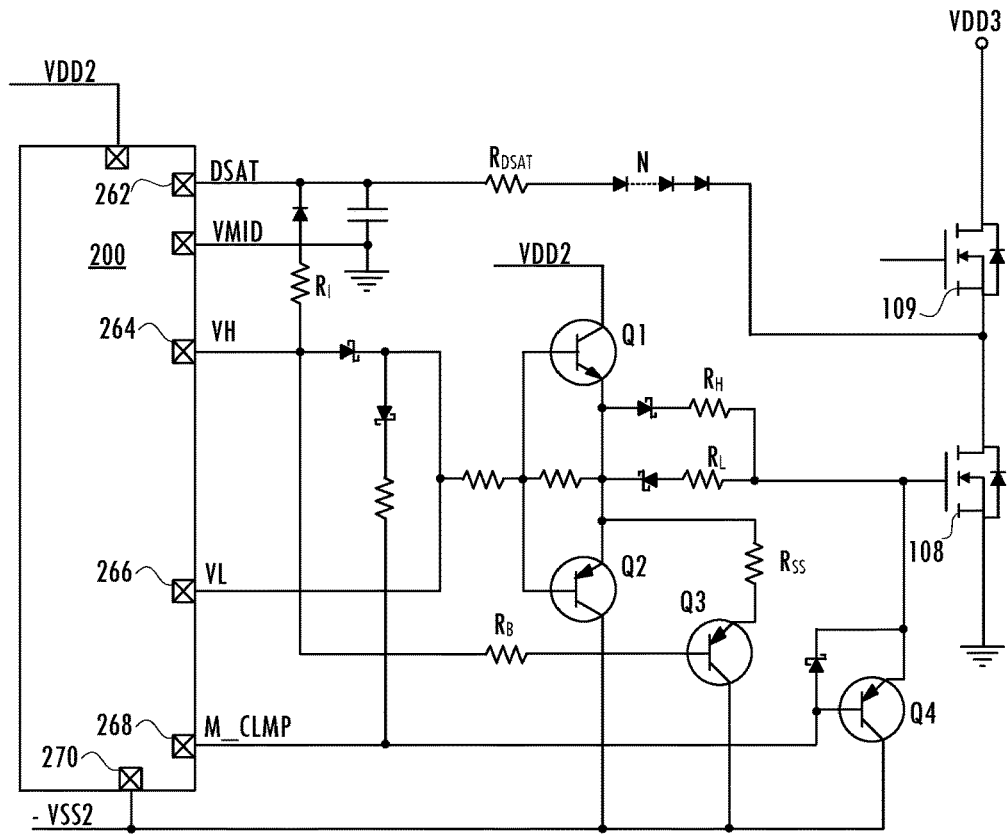
FIG. 8 illustrates a functional block diagram of a portion of a packaged driver integrated circuit product with adjustable soft shutdown, current booster, and additional features consistent with at least one embodiment of the invention.

Referring to FIG. 8, the embodiments of the adjustable soft shutdown and current booster 604 described above are compatible with additional features. For example, an embodiment of current booster 604 implemented using transistors Q1 and Q2 and the adjustable soft shutdown circuit are incorporated in an embodiment including a desaturation detection speedup circuit. An embodiment of the desaturation detection speedup circuit includes resistor $R_f$. A desaturation threshold adjustment includes resistor $R_{DSAT}$ and N diodes that are configured for a target desaturation threshold for high-power drive device 108. In addition, a robust external Miller clamp includes transistor Q4 that amplifies the Miller clamp current through terminal 268 of driver product 200. Since transistor Q4 is closer to high-power drive device 108, transistor Q4 enhances the clamping capability by reducing parasitic capacitance associated with interconnect to high-power drive device 108.

Thus, flexible soft shutdown techniques that preserve the soft shutdown functionality when implemented with current boosting techniques in applications that need additional current drive capability have been described. The description of the invention set forth herein is illustrative and is not intended to limit the scope of the invention as set forth in the following claims. For example, while the invention has been described in embodiments in which driver product 400 is used in a motor application, one of skill in the art will appreciate that the teachings herein can be utilized in other applications. Variations and modifications of the embodiments disclosed herein, may be made based on the description set forth herein, without departing from the scope of the invention as set forth in the following claims.

What is claimed is:

1. An apparatus for controlling a high-power drive device external to a package of a gate driver circuit, the apparatus comprising:
    a first circuit coupled between a first node and a control node, the first circuit being configured to charge the control node over a first length of time in response to a first signal through the first node, the first signal indicating an absence of a fault condition and a first level of a control signal;
    a second circuit coupled between a second node and the control node, the second circuit being configured to discharge the control node over a second length of time in response to a second signal through the second node, the second signal indicating the absence of the fault condition and a second level of the control signal; and
    a third circuit coupled between the first node and the control node, the third circuit comprising a current amplifier and being configured as a soft shutdown path to discharge the control node over a third length of time in response to the first signal through the first node, the first signal indicating a presence of the fault condition, the third length of time being different from the second length of time.

2. The apparatus, as recited in claim 1,
    wherein the third circuit further comprises a resistor coupled between the current amplifier and the control node.

3. The apparatus, as recited in claim 1, further comprising:
    a current boosting circuit coupled to the first circuit, the second circuit, and the third circuit,
    wherein the current boosting circuit is configured to amplify a first current received from the first node and provided to the control node by the current boosting circuit and configured to amplify a second current provided to the second node by the current boosting circuit.

4. The apparatus, as recited in claim 1, further comprising:
    a current boosting circuit comprising the current amplifier,
    wherein the current boosting circuit is configured to amplify a first current received from the first node and provided to the control node by the current boosting circuit, to amplify a second current provided to the second node by the current boosting circuit, and to amplify a third current provided to the first node.

5. The apparatus, as recited in claim 1, further comprising:
    the gate driver circuit comprising:
        a driver configured to control the high-power drive device at least partially based on a first reference voltage, a second reference voltage, and the control signal;
        a fault circuit configured to generate a failure indicator based on a voltage across terminals of the high-power drive device, the fault condition being at least partially based on the failure indicator;
        a first terminal coupled to the first node and configured to charge the control node of the high-power drive device over the first length of time in response to the absence of the fault condition and the first level of the control signal and configured to discharge the control node over the third length of time in response to the presence of the fault condition; and
        a second terminal coupled to the second node and configured to discharge the control node over the second length of time.

6. The apparatus, as recited in claim 1,
    wherein the control node is coupled to a gate terminal of the high-power drive device and the apparatus further comprises:
    a fourth circuit coupled between a third node and the control node, the fourth circuit comprising a second current amplifier configured to clamp the control node in response to a voltage on the control node falling below a predetermined threshold voltage.

7. A method for controlling a high-power drive device external to a package of a gate drive circuit, the method comprising:
    charging a control node over a first length of time using a first node in response to an absence of a fault condition and a first level of a control signal; and
    discharging the control node over a second length of time in response to the absence of the fault condition using a second node and a second level of the control signal; and
    discharging the control node over a third length of time using the first node in response to a presence of the fault condition, the third length of time being different from the second length of time,
    wherein discharging the control node over the third length of time comprises:

attenuating a voltage on the control node using a passive element; and amplifying a first current through the first node.

8. The method, as recited in claim 7, further comprising:

sensing a second voltage across terminals of the high-power drive device; and determining the fault condition at least partially based on the second voltage.

9. The method, as recited in claim 8, further comprising:

receiving the control signal from a first voltage domain by a circuit in a second voltage domain, wherein the charging the control node is further in response to the control signal having a first signal level and discharging of the control node over the second length of time is further in response to the control signal having a second signal level.

10. The method, as recited in claim 7, wherein the first length of time is based on a first passive element, the second length of time is based on a second passive element, and wherein the third length of time is based on a third passive element.

11. The method, as recited in claim 7, wherein the first node is coupled to a first terminal of the gate drive circuit and the second node is coupled to a second terminal of the gate drive circuit.

12. The method, as recited in claim 7, wherein an amplified first current flows into a ground node.

13. The method, as recited in claim 12, wherein the first current flows into the ground node via the gate drive circuit and the amplified first current flows directly into the ground node.

14. The method, as recited in claim 7, wherein charging the control node over the first length of time comprises:

generating a second current through the first node in response to the absence of the fault condition; and amplifying the second current to charge the control node over the first length of time.

15. The method, as recited in claim 7, wherein discharging the control node over the second length of time comprises:

generating a second current through the second node in response to the absence of the fault condition and a level of the control signal; and amplifying the second current to discharge the control node over the second length of time.

16. The method, as recited in claim 7, wherein the control node is coupled to a gate terminal of the high-power drive device, the method further comprising amplifying a current through a third node to clamp the control node to a ground voltage in response to the voltage on the control node falling below a predetermined threshold voltage.

17. An apparatus for controlling a high-power drive device, the apparatus comprising:

a first node;

a second node;

a control node;

means for charging the control node over a first length of time in response to a first signal through the first node and for discharging the control node over a second length of time by amplifying the first signal through the first node; and means for discharging the control node over a third length of time in response to a second signal through the second node, wherein the third length of time is different from the second length of time.

18. The apparatus, as recited in claim 17, wherein the means for discharging the control node comprises a means for amplifying the second signal through the second node.

19. The apparatus, as recited in claim 17, further comprising:

means for generating the first signal and the second signal in a first voltage domain based on a control signal received from a second voltage domain and a fault signal based on a current through the high-power drive device in the first voltage domain.

20. The apparatus, as recited in claim 17, further comprising:

the high-power drive device; and means for amplifying a current through a third node to clamp the control node to a ground voltage in response to a voltage on the control node falling below a predetermined threshold voltage, wherein the control node is coupled to a gate terminal of the high-power drive device.

* * * * *